(12) United States Patent
Lin et al.

(10) Patent No.: US 7,493,943 B2
(45) Date of Patent: Feb. 24, 2009

(54) HEAT COLLECTOR

(75) Inventors: Jhy-Chain Lin, Tu-Cheng (TW); Ga-Lane Chen, Fremont, CA (US)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 442 days.

(21) Appl. No.: 11/175,772

(22) Filed: Jul. 6, 2005

(65) Prior Publication Data

US 2007/0051497 A1  Mar. 8, 2007

(30) Foreign Application Priority Data

Jul. 16, 2004  (CN)  ......... 2004 1 0028189

(51) Int. Cl.
*F28F 7/00* (2006.01)
*H05K 7/20* (2006.01)

(52) U.S. Cl. .............. 165/185; 361/704; 428/325; 428/327; 428/331

(58) Field of Classification Search ............ 165/104.33, 165/185, 907; 29/890.03; 428/304.4, 310.5, 428/312.2, 312.6, 316.6, 318.4, 319.3, 325, 428/327, 331
See application file for complete search history.

(56) References Cited

U.S. PATENT DOCUMENTS

| | | | | |
|---|---|---|---|---|
| 3,242,984 A * | 3/1966 | Pelce et al. | ............. | 165/185 |
| 3,313,339 A * | 4/1967 | Coe | ............. | 165/80.3 |
| 4,884,331 A * | 12/1989 | Hinshaw | ............. | 29/558 |
| 5,316,080 A * | 5/1994 | Banks et al. | ............. | 165/185 |
| 5,785,913 A * | 7/1998 | Clark et al. | ............. | 264/109 |
| 6,525,939 B2 * | 2/2003 | Liang et al. | ............. | 361/697 |
| 6,735,864 B2 * | 5/2004 | Sato et al. | ............. | 29/890.03 |
| 6,840,308 B2 | 1/2005 | Ritter et al. | | |
| 2001/0051673 A1 * | 12/2001 | Suzuki et al. | ............. | 523/137 |
| 2004/0089442 A1 * | 5/2004 | Goodson et al. | ............. | 165/104.11 |
| 2004/0120827 A1 * | 6/2004 | Kim et al. | ............. | 417/48 |

FOREIGN PATENT DOCUMENTS

| TW | 544886 | 8/2003 |
|---|---|---|
| TW | 200302557 | 8/2003 |

OTHER PUBLICATIONS

CRC Handbook of Chemistry and Physics Online at http://www.hbcpnetbase.com/☐☐Performed a substance/property search for the substance air and the subject thermal conductivity.☐☐http://www.hbcpnetbase.com/articles/06_38_86.pdf.*

Yang, Yong; Physical Properties of Polymers Handbook: Thermal Conductivity, 2007, p. 155-163.☐☐Obtained from http://www.springerlink.com/content/v3242618x5n58561.☐☐Imported as thermal-Conductivity.pdf.*

* cited by examiner

*Primary Examiner*—Callie E Shosho
*Assistant Examiner*—Gerard T Higgins

(57) ABSTRACT

A heat collector (10, 20) includes a heat absorption surface (12, 22), an opposite heat focus surface (11, 21) and one or more surrounding sides (13, 23). A matrix (24) of the heat collector is a thermally conductive material. There is an adiabatic dope (25) mixed within the matrix. A relative concentration distribution of the adiabatic dope increases from the heat absorption surface to the heat focus surface, and decreases from the surrounding sides to a center of the heat collector. The shape of the heat collector can be rectangular, cylindrical, prismatic, plate-shaped, square, or polyhedral. The heat collector can draw heat generated from electrical components, and collect the generated heat for reuse in order to enhance energy efficiency.

11 Claims, 3 Drawing Sheets

HEAT COLLECTOR

FIELD OF THE INVENTION

The present invention relates to a heat collector, and more specifically, to a heat collector used to draw and reuse heat from electrical components.

BACKGROUND

With advances in electronics technology modern computer components and other electrical components can operate at high speeds and frequencies, and these electrical components typically generate large amounts of heat. Additionally, such electrical components continue to decrease in size with each succeeding generation released, and it is becoming more and more difficult to effectively dissipate heat from the components using conventional means. The electrical component may frequently operate at increased temperatures, which can lead to degradation or even failure of the component or its associated system.

There are numerous kinds of heat-dissipating devices used to cool electrical components. For example, a typical heat sink device is disclosed in U.S. Pat. No. 4,884,331 issued on Dec. 5, 1989. The heat sink includes a pedestal with dissipating fins thereon. The pedestal is attached to a surface of an electrical component, and transfers heat generated from the electrical component to ambient air.

Another kind of heat-dissipating device is a heat pipe, such as that disclosed in China patent 99117239 issued on Feb. 18, 2004. The heat pipe has high heat conductive efficiency, and dissipates heat fast.

A cooling fan is another kind of heat-dissipating device. The fan is used to speed up circulation of air around electrical components, and thereby increase heat convection. A typical example is found in U.S. Pat. No. 6,745,824 issued on Jun. 8, 2004.

Other related kinds of heat-dissipating devices include heat conductive materials, such as carbon nanotubes. The heat conductive materials have high thermal conductivity, and are typically employed between an electrical component and a heat sink. The heat conductive materials are used to reduce the thermal resistance between the electrical component and the heat sink. A typical example is found in China patent application 02152003, published on Jun. 2, 2004.

All the devices mentioned above only focus on how to dissipate heat from electrical components, without properly considering how the generated heat might be reused in order to save energy and preserve the environment. What is needed, therefore, is a device which can transfer unwanted heat from an electrical component, and which can also collect the heat for reuse by way of, for example, transformation into electricity or light.

SUMMARY

A heat collector has a heat absorption surface, an opposite heat focus surface, and one or more surrounding sides. A matrix of the heat collector is a thermally conductive material. There is an adiabatic dope mixed within the matrix. A relative concentration distribution of the adiabatic dope increases from the heat absorption surface to the heat focus surface and decreases from the surrounding sides to the center of the heat collector. The shape of the heat collector is rectangular, cylindrical, prismatic, plate-shaped, square, or polyhedral. In a preferred embodiment, a thermal conductivity of the matrix of the heat collector is greater than 0.6 W/m.K, which can be achieved with matrix material such as silver paste, silicon rubber, or non-silicon rubber. A thermally conductivity of the adiabatic dope is less than 0.1 W/m.K, which can be achieved with dope material such as polymer, a ceramic, silicon oxide, or asbestos. A relative concentration of said adiabatic dope along a central axis of the heat collector is 0%.

Some advantages of the heat collector are that it transfers the generated heat from the heat absorption surface to the heat focus surface, and at the same time it collects the heat to the central section. The collected heat is available for reuse in order to enhance energy efficiency.

Other advantages and novel features of preferred embodiments of the invention will be drawn from the following detailed description with reference to the attached drawings, in which:

DETAILED DESCRIPTION OF PREFERRED EMBODIMENTS

Hereinafter, preferred embodiments of the present invention will be described. However, the scope of the present invention is not to be taken as limited to the described embodiments.

Figure 1:
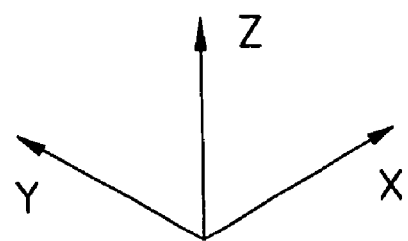
FIG. 1 is an isometric view of a rectangular heat collector in accordance with a first preferred embodiment of the present invention, the heat collector comprising adiabatic dope.
Figure 1:
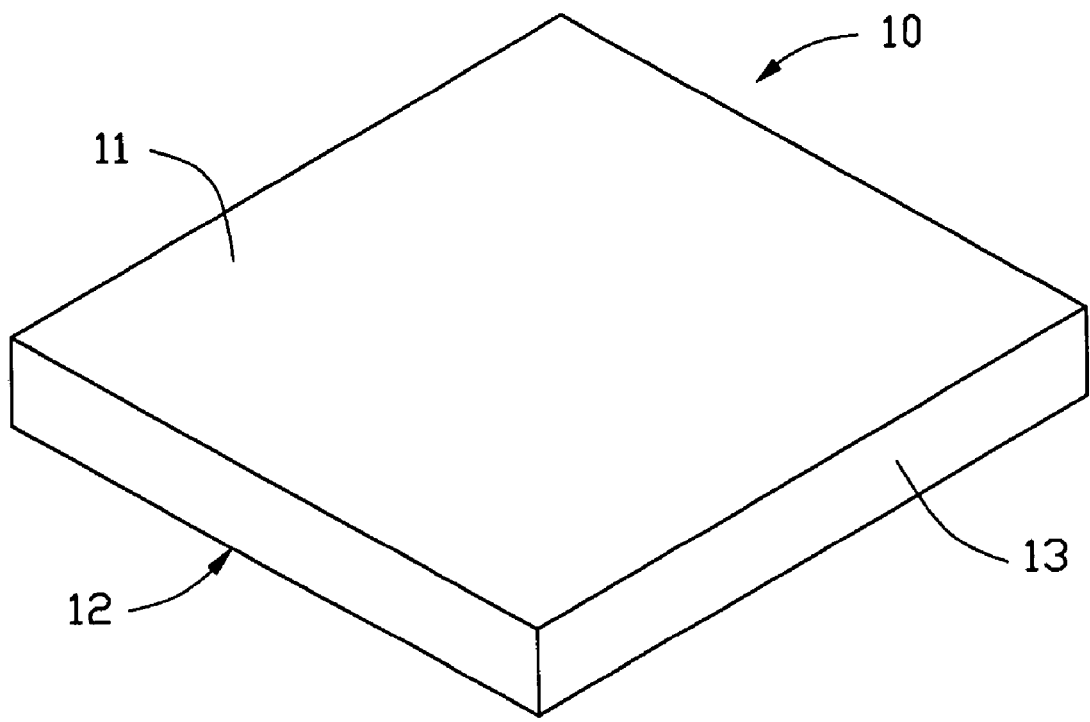

Referring to FIG. 1, the first preferred embodiment of the invention is a generally rectangular heat collector 10. The heat collector 10 has a heat focus surface 11, an opposite heat absorption surface 12, and surrounding sides 13. A matrix of the heat collector 10 is made from a thermally conductive material having a thermal conductivity greater than 0.6 W/m.K. There is adiabatic means like adiabatic dope (not shown) mixed within the matrix of the heat collector 10, and a thermal conductivity of the adiabatic dope is less than 0.1 W/m.K. X, Y and Z reference axes are defined for the heat collector 10, as shown in FIG. 1.

Figure 2:
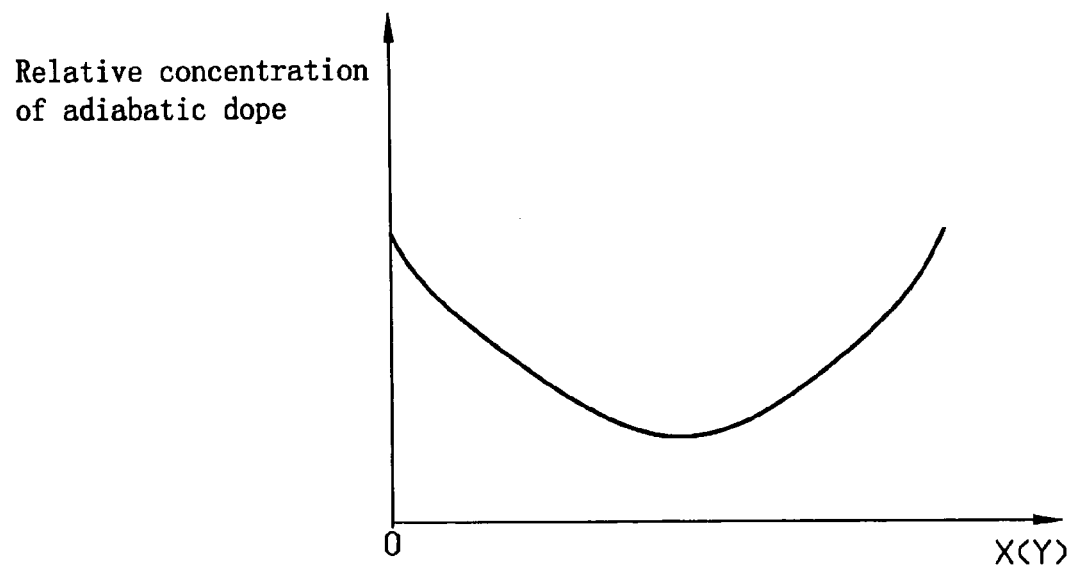
FIG. 2 is a relative concentration distribution profile of adiabatic dope along an X-axis and a Y-axis of the heat collector in accordance with the first preferred embodiment of the present invention.

FIG. 2 shows a relative concentration distribution of the adiabatic dope along the X-axis and the Y-axis of the heat collector 10. The relative concentration of the adiabatic dope is the greatest at the surrounding sides 13, and progressively decreases toward the X-Y center of the heat collector 10. A preferred concentration at the X-Y center of the heat collector 10 is 0%, and at the surrounding sides is as near as practicable to 100%.

Figure 3:
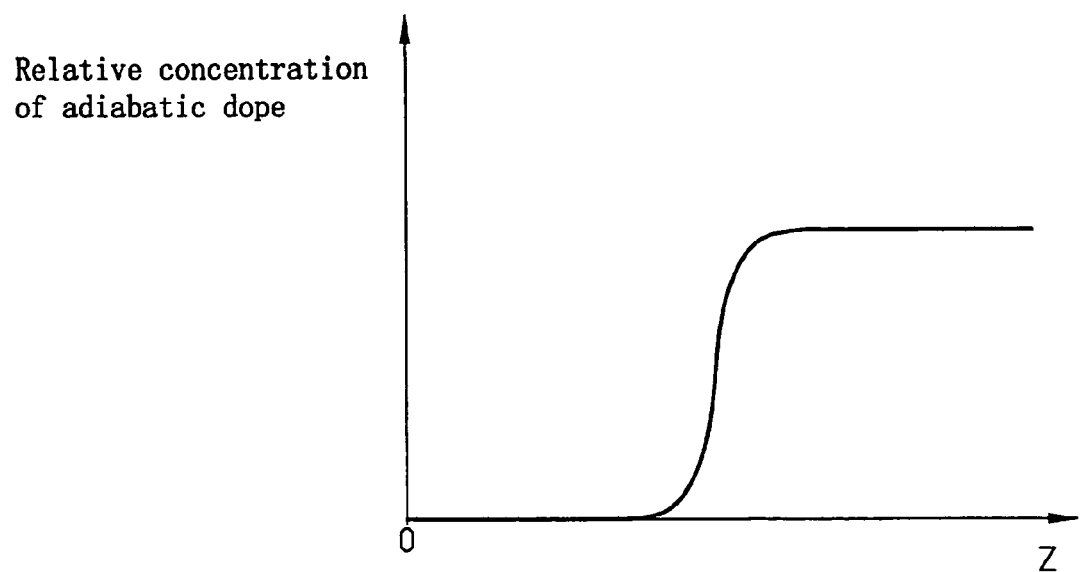
FIG. 3 is a relative concentration distribution profile of adiabatic dope along a Z-axis of the heat collector in accordance with the first preferred embodiment of the present invention.

FIG. 3 shows a relative concentration distribution of the adiabatic dope along the Z-axis of the heat collector 10. The relative concentration of the adiabatic dope is 0% at the heat absorption surface 12, and progressively increases toward the heat focus surface 11. A preferred relative concentration at the central axis of the heat collector is 0%.

Figure 4:
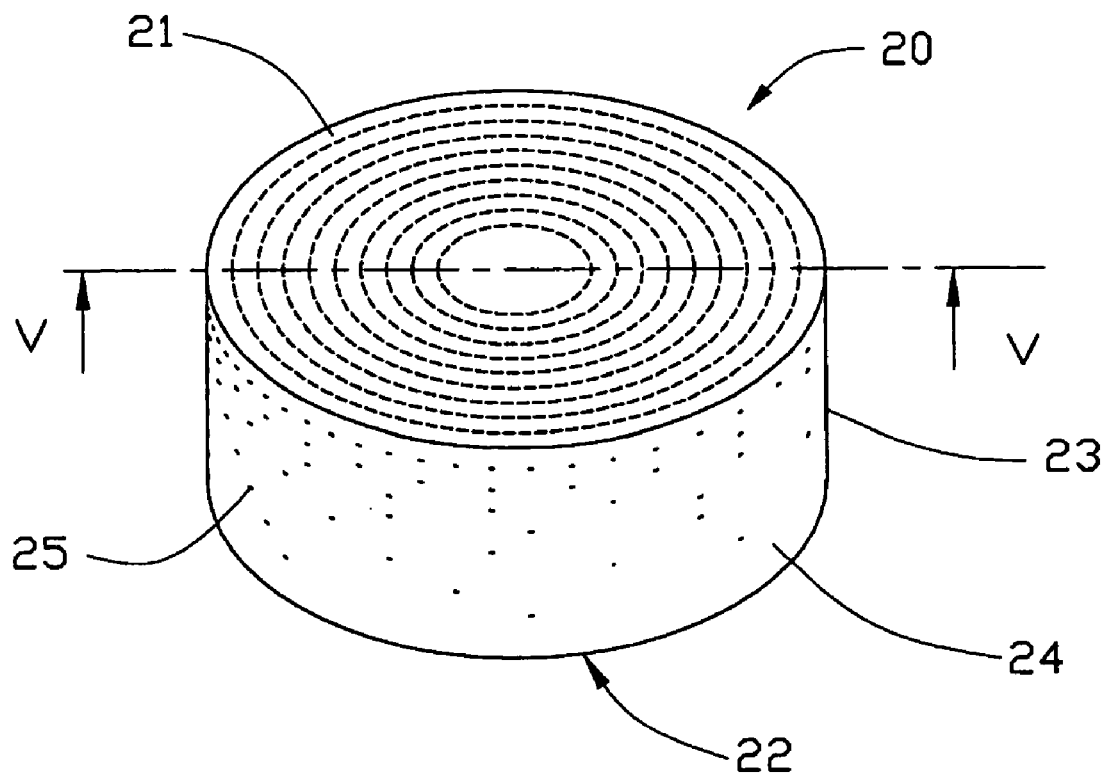
FIG. 4 is an isometric view of a cylindrical heat collector in accordance with a second preferred embodiment of the present invention, the heat collector comprising adiabatic dope.

Referring to FIG. 4, the second preferred embodiment of the invention is a generally cylindrical heat collector 20. The heat collector 20 has a heat focus surface 21, an opposite heat absorption surface 22, and a surrounding side 23. A matrix 24 of the heat collector 20 is made from a thermally conductive material having a thermal conductivity greater than 0.6 W/m.K. There is adiabatic dope 25 mixed within the matrix 24 of the heat collector 20, and a thermal conductivity of the adiabatic dope 25 is less than 0.1 W/m.K.

Figure 5:
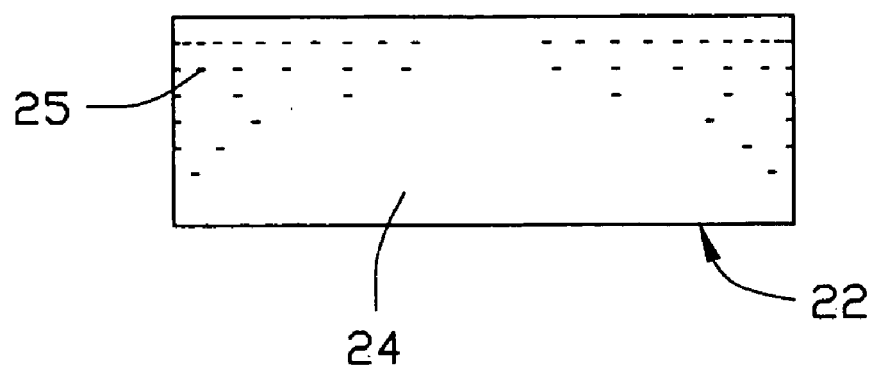
FIG. 5 is a schematic, side cross-sectional view of the heat collector of FIG. 4 taken along line V-V thereof, showing a relative concentration distribution of adiabatic dope therein.

A relative concentration distribution of the adiabatic dope 25 is shown in FIG. 5, which is a schematic cross-sectional view of the heat collector 20. In one aspect, the relative concentration distribution of the adiabatic dope 25 is radially symmetric about a central axis (not shown) of the heat collector 20. The relative concentration of the adiabatic dope 25 is the greatest at the surrounding side 23, and progressively decreases toward the central axis of the heat collector 20. A preferred relative concentration at the central axis of the heat collector 20 is 0%. In another aspect, the relative concentration of the adiabatic dope 25 is 0% at the heat absorption surface 22, and progressively increases toward the heat focus surface 21. A preferred relative concentration at a periphery of the heat focus surface 21 is as near as practicable to 100%.

The matrixes of the heat collectors 10, 20 are preferably made from flexible materials, such as silver paste, silicon rubber, or non-silicon rubber. The adiabatic dope may be a polymer, a ceramic, silicon oxide and/or asbestos. Further or alternatively, the adiabatic means may take the form of a plurality of pores in the heat collectors 10, 20.

Besides being generally rectangular or cylindrical, the shape of the heat collectors 10, 20 is alternatively, for example, prismatic, plate-shaped, generally square, or polyhedral. Each of the heat absorption surfaces 12, 22 is suitable for attachment to a heat generating surface of an electronic component (not shown). The heat collector 10, 20 transfers heat generated from the surface of the electronic component to the heat focus surface 11, 21. Because the relative concentration distribution of the adiabatic dope guides the heat flow from non-convergence to convergence, it is easy to collect and reuse the generated heat.

Although only preferred embodiments have been described in detail above, it will be apparent to those skilled in the art that various modifications are possible without departing from the inventive concepts herein. Therefore the invention is not limited to the above-described embodiments, but rather has a scope defined by the appended claims and allowable equivalents thereof.

What is claimed is:

1. A heat collector comprising two opposite surfaces and one or more surrounding sides; wherein a matrix of the heat collector is made from a thermally conductive material; an adiabatic dope selected from a group consisting of polymers, ceramics, silicon oxides, and asbestos is mixed within the matrix; and a relative concentration distribution of said adiabatic dope increases from one of the opposite surfaces to the other opposite surface, and decreases from the surrounding sides to the center of the heat collector.

2. The heat collector according to claim 1, wherein the heat collector is rectangular, cylindrical, prismatic, plate-shaped, square, or polyhedral.

3. The heat collector according to claim 1, wherein a thermal conductivity of said thermally conductive material is greater than 0.6 W/m.K.

4. The heat collector according to claim 1, wherein said thermally conductive material is flexible.

5. The heat collector according to claim 4, wherein said thermally conductive material is silver paste, silicon rubber, or non-silicon rubber.

6. The heat collector according to claim 1, wherein a thermal conductivity of said adiabatic dope is less than 0.1 W/m.K.

7. The heat collector according to claim 1, wherein the opposite surface that has the smaller relative concentration of said adiabatic dope is a heat absorption surface.

8. The heat collector according to claim 7, wherein a relative concentration of said adiabatic dope at the heat absorption surface is 0%.

9. The heat collector according to claim 1, wherein the opposite surface that has the larger relative concentration of said adiabatic dope is a heat focus surface.

10. The heat collector according to claim 9, wherein a relative concentration of said adiabatic dope at the center of the heat focus surface is 0%, and increases from the center to the surrounding sides.

11. The heat collector according to claim 1, wherein a relative concentration of said adiabatic dope along the central axis of the heat collector is 0%.

* * * * *